United States Patent [19]

Sato et al.

[11] 4,112,190
[45] Sep. 5, 1978

[54] METALLIZED PLASTIC MOLDING

[75] Inventors: Mitsuo Sato; Norio Miyagawa, both of Nagoya; Juichi Kobayashi, Aichi, all of Japan

[73] Assignee: Mitsubishi Rayon Co., Ltd., Tokyo, Japan

[21] Appl. No.: 807,149

[22] Filed: Jun. 16, 1977

[30] Foreign Application Priority Data

Jun. 21, 1976 [JP] Japan .................................. 51-73628

[51] Int. Cl.² ...................... B32B 15/08; B32B 27/00
[52] U.S. Cl. .................................. 428/457; 156/272; 427/250; 427/252
[58] Field of Search ................ 428/457, 458, 913, 31; 156/272; 427/250, 252

[56] References Cited

U.S. PATENT DOCUMENTS

| | | | |
|---|---|---|---|
| 2,782,131 | 2/1957 | Johnson | 428/458 |
| 2,873,210 | 2/1959 | Barrett et al. | 428/458 |
| 2,949,380 | 8/1960 | Stuart | 428/457 |
| 2,993,806 | 7/1961 | Fisher et al. | 427/250 X |
| 3,146,146 | 8/1964 | Anderson | 156/272 |
| 3,194,777 | 7/1965 | Christenson et al. | 428/457 X |
| 3,669,796 | 6/1972 | Hall | 156/272 |
| 3,669,825 | 6/1972 | Hall | 156/272 |
| 4,005,238 | 1/1977 | Gaehde et al. | 428/458 X |

*Primary Examiner*—Harold Ansher
*Attorney, Agent, or Firm*—Oblon, Fisher, Spivak, McClelland & Maier

[57] ABSTRACT

A metallized plastic molding comprises a plastic substrate, a primer layer having a gel percentage of at least 80% and a swelling degree of 20% or less deposited on said substrate and a metallic film deposited on the primer layer. The metallized plastic molding is prepared by coating a plastic substrate with a primer forming material containing at least one compound having a molecular weight of 150 – 2000 and containing at least two polymerizable unsaturated groups in one molecule, curing the primer forming material so that it has a gel percentage of at least 80% and a swelling degree of 20% or less to form a primer layer and then depositing a metallic film layer by a dry type method on the primer layer.

5 Claims, No Drawings

METALLIZED PLASTIC MOLDING

BACKGROUND OF THE INVENTION

1. Field of the Invention

The present invention relates to metallized plastic moldings in which a plastic substrate is coated with a primer layer and then a metallic film layer is deposited on the primer layer and to a method for producing the same.

2. Description of the Prior Art

In the past, metallized plastic moldings composed of a plastic substrate wherein one of the surfaces of the substrate has been subjected to metallizing treatment have been used for various decorative articles, mirrors, and the like. The structures have been used because of such advantages as high productivity, good moldability, light weight, and the like, which are characteristic properties of plastics. Plastic substrates have been metallized in the past by plating methods, hot-stamping methods, vacuum evaporation methods, sputtering methods, ionizing plating methods and the like. Among these techniques the plating method is most commonly used. The plating method involves subjecting the surface of a plastic substrate to chemical plating and then to electroplating. However, the steps of this method are complicated and an additional problem is the necessity of disposing of toxic waste plating solutions and the high cost of disposing of the solutions. For this reason, it would be highly desirable to have a method of metallizing plastic moldings which is simple and which presents no aqueous waste liquor disposal problems as a substitute for the plating method. For this reason such dry methods of forming metallic films as vacuum evaporation, sputtering, and the like have been considered. Although plastic moldings having a metallic gloss can be prepared by these dry methods, the metallic film layers formed by these methods are extremely thin and are not very adhesive to the plastic substrate. Consequently, the resulting products exhibit substantially inferior properties such as abrasion resistance and weather resistance. A recent method which has been proposed to increase the strength of the metallic film layer formed by the dry metallic film forming methods involves the coating of a plastic substrate with various primer materials such as a composition of acrylpolyol and polyisocyanate on the surface of a plastic substrate, heat treating the coated substrate to form a primer layer and then forming a metallic film layer thereon by a dry metallic film forming method. This method has provided considerably good results. However, the metallized plastic moldings obtained by this technique exhibit low adhesivity between the primer layer and the metallic film layer and as a result the metallized substrates do not exhibit abrasion resistance and weather resistance properties. During the formation of the metallic film layer or during the use of the metallized plastic moldings, especially in outdoor use, the metallized products develop haze, whiten, cracks develop and the rainbow phenomenon occurs in the metallic film layer and accordingly these products are not practically useful. A need, therefore, continues to exist for a dry method of metallizing plastic substrates to form a product in which there is substantial adhesivity between plastic substrate and metal layer.

SUMMARY OF THE INVENTION

Accordingly, one object of the present invention is to provide metallized plastic moldings which have excellent properties which have not been achieved by the conventional plastic moldings and which have a sufficiently crosslinked and cured primer layer on the surface of the plastic substrate between the substrate and applied metallic film.

Another object of the present invention is to provide a method for forming metallized plastic moldings of excellent adhesivity between plastic and metal layer of excellent abrasion resistance and weather resistance and having a beautiful appearance by forming a hard sufficiently crosslinked and cured primer layer on a plastic substrate and then forming a metallic film layer thereon by a dry tape film forming method.

Briefly, these objects and other objects of the present invention as hereinafter will become more readily apparent can be attained by a metallized plastic molding comprising a plastic substrate, a primer layer of a gel percentage of at least 80% and a swelling degree of not more than 20% on the substrate and a metallic film layer on the primer layer. The metallized plastic molding is prepared by coating a primer forming material which contains at least one compound having a molecular weight of 150-2000 and containing at least two polymerizable unsaturated groups in one molecule on the surface of a plastic substrate, curing the material so that it has a gel percentage of at least 80% and a swelling degree of 20% or less to form a primer layer and then depositing a metallic film on the primer layer by a dry tape method.

DESCRIPTION OF THE PREFERRED EMBODIMENTS

Suitable plastic substrates used in this invention include thermoplastic resins such as ABS resins, AS resins, polystyrene resins, polyacrylic resins, polyvinyl chloride resins, polycarbonate resins, polypropylene resins, polyethylene resins, polyester resins, polyamide resins and the like; and thermosetting resins such as phenol resins, urea resins, melamine resins, unsaturated polyester resins and the like.

The unsaturated compounds which are used for forming a primer layer are those which have a molecular weight of 150-2000 and which contain at least two polymerizable unsaturated groups in one molecule. Specific examples of the compounds include ethylene glycol diacrylate and dimethacrylate, diethylene glycol diacrylate and dimethacrylate, triethylene glycol diacrylate and dimethacrylate, tetraethylene glycol diacrylate and dimethacrylate, propylene glycol diacrylate and dimethacrylate, butylene glycol diacrylate and dimethacrylate, pentane diol diacrylate and dimethacrylate, neopentyl glycol diacrylate and dimethacrylate, hexanediol diacrylate and dimethacrylate, glycerine diacrylate and dimethacrylate, glycerine triacrylate and trimethacrylate, trimethylolpropane diacrylate and dimethacrylate, trimethylolpropane triacrylate and trimethacrylate, pentaerythritol diacrylate and dimethacrylate, pentaerythritol triacrylate and trimethacrylate, pentaerythritol tetracrylate and tetramethacrylate, diglycerine tetracrylate and tetramethacrylate, dipentaerythritol hexacrylate and hexamethacrylate, and compounds represented by the formula:

wherein
R₁ is H or CH₃, R₂ is an alkylene group of 1-6 carbon atoms or $(CH_2-CHR_1O)_n$, wherein R₁ is the same as defined above and n is an integer of not more than 6, R₃ is an alkylene group of 2-6 carbon atoms or a phenylene group and m is an integer of 1-10.

Unsaturated compounds include the addition reaction products of acrylic acid or methacrylic acid and glycidyl acrylate or methacrylate, compounds obtained by adding polymerizable monomers having carboxyl groups to compounds having at least two epoxy groups in one molecule by ring-opening esterification, and the like.

Examples of diol compounds which are skeleton compounds used in the preparation of diacryloylated or dimethacryloylated polyesters represented by formula (I) include ethylene glycol, propylene glycol, buylene glycol, hexylene glycol, diethylene glycol, triethylene glycol, tetraethylene glycol, hexaethylene glycol, and the like and examples of dicarboxylic acids used in the preparation of polyesters of formula I include succinic acid, adipic acid, sebacic acid, phthalic acid, isophthalic acid, terephthalic acid, and the like. Furthermore, examples of compounds having at least two epoxy groups in one molecule include polyethylene glycol derivatives such as ethylene glycol diglycidyl ether, triethylene glycol diglycidyl ether, tetraethylene glycol diglycidyl ether, and the like; polypropylene glycol derivatives such as propylene glycol diglycidyl ether, tripropylene glycol diglycidyl ether, and the like; aliphatic derivatives such as neopentyl glycol diglycidyl ether, 1, 6-hexane diol diglycidyl ether, and the like; alicyclic glycidyl derivatives such as hydrogenated bisphenol A diglycidyl ether, cyclohexane diol digylcidyl ether, and the like; glycidylamine derivatives such as diglycidyl aniline, diglycidylbenzylamine, 1, 3-diglycidyl-5, 5-dimethylhydantoin, and the like; 2, 2'-dibromoneopentyl glycol diglycidyl ether, condensation products of bisphenol A and epichlorohydrin or methylepichlorohydrin such as commerically available Epon 562, Epon 828, Epon 834, Epon 864, Epon 1001, Epon 1004 (prepared by Shell Chemical Co.), etc.

Suitable polymerizable monomers containing carboxyl groups include acrylic acid, methacrylic acid, crotonic acid, monoacryloxyethyl phthalate, monomethacryloxyethyl phthalate, monoacryloxypropyl phthalate, monomethacryloxypropyl phthalate, monoacryloxyethyl tetrahydrophthalate, monomethacryloxy tetrahydrophthalate, monoacryloxypropyl tetrahydrophthalate, monomethacryloxypropyl tetrahydrophthalate, monoacryloxyethyl hexahydrophthalate, monomethacryloxy hexahydrophthalate, monoacryloxypropyl hexahydrophthalate monomethacryloxypropyl hexahydrophthalate, and the like.

The unsaturated compounds used in the formation of the primer layer must have a molecular weight of 150-2,000. Compounds having a molecular weight of less than 150 cannot provide a primer layer which has excellent characteristics such as impact resistance, and the like, and thus metallized plastic moldings can not be formed which have good properties. On the other hand, primer layers which are formed by curing unsaturated compounds having a molecular weight of more than 2,000 possess insufficient crosslinking density. Moreover, the primer layers greatly elongate and shrink when they are heated or subjected to low temperatures, which causes the metallic film layer deposited thereon to easily break.

From these considerations it is necessary that the primer layer have a gel percentage of at least 80% and a swelling degree of not more than 20%, more preferably a gel percentage of at least 90% and a swelling degree of not more than 10%. If a metallic film is formed on a primer layer which does not satisfy the conditons of a gel percentage of at least 80% and a swelling degree of not more than 20%, the adhesion between the metallic film layer and the primer layer is insufficient and whitening, haze formation and the rainbow phenomenon readily occur in the metallic film layer. Also, cracks easily form in the metal layer.

Preferred primer forming materials for the preparation of the primer layer described above include mixtures of a compound (A) which has a molecular weight of at least 150 but less than 450 and which contains at least two polymerizable unsaturated groups in one molecule and a compound (B) which has a molecular weight of 450-2,000 and which contains at least two polymerizable unsaturated groups in one molecule in a weight ratio (A)/(B) of 1/9-9/1. Primer layers which are formed from such primer forming materials adhere excellently to the plastic substrate and the properties of the resulting film are excellent. Moreover, the primer layer has a high crosslink density. Therefore, when a metallic film layer is formed on the primer layer, metallized plastic moldings are formed which exhibit excellent adhesivity between the primer layer and the metallic film. Consequently, the laminated product does not exhibit whitening, haze, the rainbow phenomenon and cracks do not develop in the laminated product. The best results are especially obtained when the primer layer is formed of the condensation product of a compound having at least two hydroxyl groups in one molecule and a polymerizable monomer containing carboxyl groups which is used as compound (A) which has a molecular weight of at least 150 but less than 450 and which contains at least two polymerizable unsaturated groups in one molecule and the addition product designated as compound (B) of a polymerizable monomer having carboxyl groups and a compound having at least two epoxy groups in one molecule which is formed by a ring-opening esterification reaction. Compound (B) has at least two polymerizable unsaturated groups in one molecule.

The formation of a primer layer having a gel percentage of at least 80% and a swelling degree of not more than 20% can be achieved by heat treating the unsaturated compounds to which peroxides such as lauryl peroxide, benzoyl peroxide, and the like have been previously added or by irradiation of the primer forming materials with active energy radiation. Suitable active energy radiation includes X-rays, γ-rays, electron rays, light rays of a wavelength of 2,000-8,000Å and the like. When light rays of a wavelength of 2,000-8,000Å are used, it is desirable to add a photopolymerization initiator in an amount of 0.05-10% by weight to the primer layer composition, preferably in an amount of 0.1-5% by weight of the unsaturated compounds. Suitable examples of the photopolymerization initiator include benzophenone and derivatives thereof, propiophenone and derivatives thereof, benzoin, benzoinmethyl ether, benzoinisobutyl ether, methylphenyl glyoxime, ethylphenyl glyoxime, phenanthraquinone, and the like.

When active energy radiation is used to initiate the formation of a primer layer having a gel percentage of at least 80% and a swelling degree of not more than 20% from the primer layer forming materials, an atmosphere of either an inert gas or air may be used as the atmosphere over the primer layer materials when the layer is subjected to active energy radiation. However, when active energy rays are used in air, it is preferred to subject the primer layer to additional irradiation with active energy radiation while under an inert gas atmosphere or while the primer layer is covered with an aqueous layer. This method is preferred because the resulting primer layer exhibits a higher gel percentage and a lower swelling degree and a greater crosslinking density can be achieved. Moreover, when the surface layer of the plastic substrate is irradiated with active energy radiation prior to the application of the primer forming materials, the adhesiveness between the plastic substrate and the primer layer can be further increased.

The primer layer attained in this invention desirably possesses a high surface smoothness. In order to form a primer layer of especially high surface smoothness, it is preferred to incorporate a leveling agent such as a surfactant, a fluorine containing monomer, a silicone compound, or the like in the primer layer materials in an amount of 0.01–10% by weight of the unsaturated compounds. Suitable examples of surfactants include alkylbenzene sulfonates, alkylallyl sulfonates, sorbitan ester surfactants, polyethylene glycol oleyl esters, polyoxyethylenefluorocarbon amides, $C_5F_7H_4COOC_4H_9$, potassium perfluorooctasulfonate, $HC_6F_{12}CH_2OCH_3$, and the like. Suitable examples of the fluorine-containing monomers include 2, 2, 3, 3 tetrafluoropropyl acrylate or methacrylate, 1, 1, 1, 3, 3, 3-hexafluoropropyl acrylate or methacrylate, 2, 2, 2-trifluoroethyl acrylate or methacrylate, perfluoropropoxy -1, 1-dihydroxyfluoropropyl acrylate or methacrylate. Suitable examples of silicone compounds include silicone block polymers of the formula:

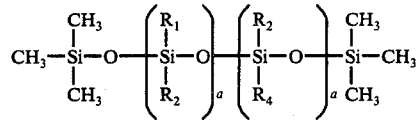

wherein $R_1$, $R_2$, $R_3$ and $R_4$ are radicals selected from the group of hydrogen atoms, methyl groups, phenyl groups, and halogenophenyl groups and $a$ and $b$ are integers.

The thickness of the primer layer formed by the deposition of the primer forming materials which are mainly composed of unsaturated compounds is preferably as thin as possible and ordinarily less than 50 μm. In order to form a primer layer which has excellent surface smoothness properties and is of the proper thickness, the vicosity of the applied solution must be adjusted so that a primer layer of proper thickness can be formed. If the viscosity of the primer layer materials is relatively high, a diluent is preferably added to reduce the viscosity of the primer layer constituents. Preferred diluents include the usual organic solvents and active monomers. Suitable examples or organic solvents as diluents include ethyl acetate, butyl acetate, acetone, methylethyl ketone, methylisobutyl ketone, ethyl alcohol, isopropyl alcohol, butyl alcohol, toluene, xylene, butyl carbitol, and the like. Suitable examples of the active monomers include acrylates or methacrylates containing an alkyl ester portion of 1–18 carbon atoms such as methyl methacrylate, ethyl acrylate, butyl methacrylate, 2-ethylhexyl acrylate, and the like; vinyl acetate, vinyl propionate, styrene, vinyl toluene, α-methylstyrene, N-vinylpyrrolidone, and the like.

The metallized plastic moldings of the present invention can be prepared by coating the primer forming materials onto the surface of the plastic substrate, irradiating the coated layer with active energy radiation to form a hardened primer layer of excellent adhesive characteristics and having a gel percentage of at least 80% and a swelling degree of not more than 20%. Thereafter, the metallic film layer can be deposited thereon.

The deposition of the metallic film layer can be accomplished preferably by a vacuum evaporation method, a sputtering method, an ion plating method, or the like which are all conventional dry type methods for the deposition of metallic films. Suitable metals useful for the deposition of metallic films include various metals such as antimony, aluminum, tin, iron, nickel, zinc, chromium, copper, and the like and alloys of these metals may be used. When the metallic film is formed by vacuum evaporation or sputtering using chromium or alloys containing chromium such as stainless steel, nichrome, or the like, the resulting laminated product has a color close to the color of plated chromium and also possesses superior endurance characteristics in comparison to metal laminated films obtained by other methods. The metallic film product formed by the prior art methods is apt to retain an internal strain and will generate cracks while the product prepared by the present method retains no internal strain within the metal layer and cracks will not form because of the special primer layer which has an increased crosslinking density, and which has a gel percentage of at least 95% and a swelling degree of not more than 10%.

The metallized plastic moldings of the present invention produced by the method described above are superior to the products produced by the conventional methods with regard to a number of features including metallic luster, no stress whitening, no haze formation, the lack of the presence of the rainbow phenomenon, and the lack of generation of cracks on the metal surface. Moreover, the metallic film of the present product firmly adheres to the plastic substrate and the internal strain can be sufficiently relieved and absorbed, and as a consequence, the products possess excellent endurance.

When the metallized plastic moldings of the present invention are used outdoors and if the scratch and damage resistance properties of the product are of special importance, one or more coating layers can be deposited on the existing metal layer to bolster the extremely thin thickness of the metallic film.

The metal layer can be coated with a synthetic resin coating. Suitable coating materials which provide suitable coating layers include urethane paints which are capable of being crosslinked or cured at relatively low temperatures, e.g., those which comprise xylenediisocyanate, hexamethylenediisocyanate or a polisocyanate obtained by increasing the molecular weight of the isocyanates with a chain extender and a polyol, e.g., acrylic polyols, polyester polyols, or the like, or coating materials capable of being crosslinked or cured by irradiation with active energy radiation e.g, those materials mainly composed of polyvinyl compounds obtained by the urethane formation reaction of a compound having at least two hydroxyl groups with an addition product of an unsaturated polyester diisocyanate compound and a vinyl monomer having a hydroxyl group, polyvinyl compounds obtained by adding a vinyl monomer having carboxyl groups to a compound having at least two epoxy groups by a ring-opening esterification reaction, polyvinyl compounds which are the condensation product of a compound having at least two hydroxyl groups and a vinyl monomer having carboxyl group and the like.

The metallized plastic moldings of the present invention have a beautiful appearance comparable to the appearance of metallic articles and are very light in weight so they can be utilized in the fabrication of car parts, decorative articles, mirrors and the like as substitutes for metallic articles. Thus, the products of the present invention have various advantages over those produced by the conventional methods and are of practical value.

Having generally described this invention, a further understanding can be obtained by reference to certain specific examples which are provided herein for purposes of illustration only and are not intended to be limiting unless otherwise specified.

The amounts of materials expressed in parts are parts by weight.

An example of a preparation of an unsaturated compound:

(A) 330 Parts of bisphenol A type epoxy resin (epoxy equivalent: 300–375; Epon 864 from Shell Chemical Co.), 72 parts of acrylic acid, 4 parts of tributylamine and 0.5 part of hydroquinone monomethyl ether were blended and weee reacted at 95° C. for 6 hours whereby an unsaturated compound (A) having two acryloyloxy groups in one molecule was obtained. Compound (A) had a number average molecular weight of 844 as determined by the end-group determination method.

(B) The addition reaction of acrylic acid was effected in the same manner as described in (A) above except that a bisphenol A type epoxy resin of an epoxy equivalent of 225–280 (Epon 834 from Shell Chemical Co.) was used in the reaction whereby an unsaturated compound (B) having two acryloyloxy groups in one molecule was obtained, which had a number average molecular weight of 614 as determined by the end-group determination method.

(C) An unsaturated compound (C) having two acryloyloxy groups in one molecule was obtained in the same manner as described in method (A) above except that an epoxy resin having an epoxy equivalent of 182–194 (Epon 828 from Shell Chemical Co.) was used. Compound (C) had a number average molecular weight of 510 as determined by the end-group determination method.

(D) 148 Parts of phthalic anhydride, 116 parts of 2-hydroxyethyl acrylate, 4 parts of tributylamine and 0.5 parts of hydroquinone monomethyl ether were blended and reacted at 95° C. for 2 hours where a material was obtained having an acid value of about 212. Then, 330 parts of bisphenol A type epoxy resin (Epon 864 from Shell Chemical Co., epoxy equivalent 300–375) was added thereto and the reaction was conducted at 95° C. for 6 hours whereby an unsaturated compound (D) having two acryloyloxy groups in one molecule was obtained. Compound (D) had a number average molecular weight of 1,210 as determined by the end-group determination method.

(E) 207 parts of phthalic anhydride and 321 parts of neopentyl glycol were charged into a reactor equipped with a stirrer, a thermometer, a partial condenser, a total condenser and a nitrogen gas introducing pipe, and the reaction was continued at 210° C. for 5 hours while nitrogen gas was passed therethrough. The water of condensation was removed until a material having an acid value of 0.5 was obtained. The polyester obtained had a hydroxyl value of 376. To 418 parts of the polyester were added 253 parts of acrylic acid, 4.4 parts of hydroquinone, 1.5 parts of concentrated sulfuric acid and 98 parts of toluene and the mixture was reacted in a reactor equipped with a stirrer, a thermometer and a Dean Stark type trap at 95°–100° C. under reduced pressure for 5 hours while the water of condensation was removed. The reaction was discontinued when no further water of condensation was evolved. Unreacted acrylic acid, hydroquinone and concentrated sulfuric acid were removed by washing the reaction product with alkali and water and then toluene was removed whereby an unsaturated compound (E) having two acryloyloxy groups in one molecule which had a number average molecular weight of 446 as determined by the end-group determination method was obtained.

EXAMPLE 1

A primer forming material prepared as described in experiment No. 1 was prepared by blending the unsaturated compounds as shown in Table 1 and then was coated on an ABS resin molding to a thickness of 10 $\mu$m. The applied primer was irradiated with ultraviolet radiation for 20 seconds in air by placing it at a distance of 20 cm from a high pressure mercury arc lamp having an intensity of 80 W/cm to form a primer layer having a gel percentage of 92% and a swelling degree of 11%. Stainless steel was vapor deposited to a thickness of 0.2 $\mu$m on the primer layer by a vacuum evaporation method whereby a metallized plastic molding, which had excellent properties as shown in Table 1 was obtained.

EXAMPLES 2–7

Primer forming materials prepared as described in experiments No. 2–7 in Table 1 were prepared by blending the unsaturated compounds shown in Table 1. Each of the primer forming materials were coated to a thickness of 10 $\mu$m on the plastic molding substrate shown in Table 1. Each sample was irradiated with ultraviolet radiation for 20 seconds in air by placing it at a distance of 20 cm from a high pressure mercury arc lamp having an intensity of 80 W/cm thereby forming primer layers having the gel percentages and the swelling degrees shown in Table 1. The coated substrates were treated using dry type metallic film forming methods and the metals shown in Table 1 whereby metallized plastic moldings were obtained. The properties of the thus obtained metallized plastic moldings are shown in Table 1.

EXAMPLE 8

The primer forming material of experiment No. 8 was prepared by blending the unsaturated compounds shown in Table 1 and was coated to a thickness of 10 $\mu$m on an ethylene-propylene copolymer resin molding. The applied layer was irradiated with electron radiation at an absorbed dosage of 10 Mrad under an acceleration voltage of 300 KV in a nitrogen atmosphere to form a primer layer of a gel percentage of 96% and a swelling degree of 4%. The primer layer was treated by a sputtering method to form a stainless steel film having a thickness of 0.05 μm whereby a metallized plastic molding was obtained. The properties of this molding were excellent as shown in Table 1.

EXAMPLE 9

The primer forming material of experiment No. 9 in Table 1 was prepared by blending the unsaturated compounds shown in Table 1 and was coated to a thickness of 10 μm on an ABS resin molding. The applied layer was irradiated with electron radiation at an absorbed dosage of 10 Mrad under an acceleration voltage of 300 KV in a nitrogen atmosphere whereby a primer layer of a gel percentage of 96% and a swelling degree of 4% was formed. A stainless steel layer was deposited on the primer layer by a sputtering method to a thickness of 0.05 μm whereby a metallized plastic molding was obtained which had the excellent properties shown in Table 1.

COMPARATIVE EXAMPLE 1

The primer forming material of experiment No. 10 in Table 1 was prepared by blending the unsaturated compounds shown in Table 1 and was coated to a thickness of 10 μm on an ABS resin molding. The applied layer was irradiated for 20 seconds with ultraviolet radiation in air by placing it at a distance of 20 cm from a high pressure mercury arc lamp having an intensity of 80 W/cm whereby a primer layer having a gel percentage of 85% and a swelling degree of 25% was formed. Stainless steel was vapor deposited on the layer to a thickness of 0.2 μm on the primer layer by a vacuum evaporation method whereby a metallized plastic molding was obtained. The molding had various defects as shown in Table 1 and was not suitable for practical use.

COMPARATIVE EXAMPLE 2

The primer forming material indicated by experiment No. 11 in Table 1 and identical with that of experiment No. 8 in Example 8 was coated to a thickness of 10 μm on an ethylene-propylene copolymer molding. The applied material was irradiated with electron radiation at an absorbed dosage of 10 Mrad under an acceleration voltage of 300 KV in air to form a primer layer having a gel percentage of 77% and a swelling degree of 28%. Stainless steel was vapor deposited on the layer to a thickness of 0.2 μm by a vacuum evaporation method whereby a metallized plastic molding was obtained. The resultant molding had various defects as shown in Table 1 and was not suitable for practical use.

COMPARATIVE EXAMPLE 3

The primer forming material of experiment No. 12 and comprising 50 parts of acrylopolyol having a hydroxyl value of 30 and 21.4 parts of tolylenediisocyanate as shown in Table 1 was coated to a thickness of 10 μm on an ABS resin molding and was dried at 80° C. for 6 hours whereby a primer layer having a gel percentage of 84% and a swelling degree of 25% was formed. Stainless steel was vapor deposited to a thickness of 0.2 μm on the primer layer by a vacuum evaporation method whereby a metallized plastic molding was obtained. The resultant molding had various defects as shown in Table 1 and was not suitable for practical use.

TABLE 1

| Experiment No. | | 1 | 2 | 3 | 4 | 5 | 6 | 7 | 8 | 9 | 10 | 11 | 12 |
|---|---|---|---|---|---|---|---|---|---|---|---|---|---|
| | | | | | EXAMPLES (numbers parts by weight) | | | | | | | Comparative Examples | |
| Composition of primer forming material | Unsaturated Compounds | | | | | | | | | | | | Primer forming material comprising 50 parts of acryl polyol having OH value of 30 and 21.4 parts of tolylene diisocyanate | Primer forming material comprising 50 parts of acryl polyol having OH value of 30 and 21.4 parts of tolylene diisocyanate |
| | Unsaturated Compound (A) (MW 844) | 50 | | | | 50 | | | 30 | | | 30 | |
| | Unsaturated compound (B) (MW 614) | | 50 | 60 | 50 | | 60 | 50 | | 30 | 30 | | |
| | Unsaturated compound (C) (MW 510) | | | | | | 20 | | | 20 | | | |
| | Unsaturated compound (D) (MW 1210) | | | | | | | | | | | | |
| | Unsaturated compound (E) (MW 446) | | | | | | | | | | | | |
| | Polyethylene glycol diacrylate (MW 744) | 10 | | | | | | | | | | | |
| | Polyethylene glycol sebacate diacrylate (MW 744) | 40 | | | | | | | | 10 | | | |
| | Bisphenol A dioxyethylether diacrylate (MW 424) | | | | | | | | | | 40 | | |
| | 1,6-Hexanediol diacrylate (MW 226) | | 20 | | | 10 | 20 | 40 | | | | 10 | |
| | Neopentyl glycol diacrylate (MW 214) | | | | | | | | 10 | | | | |
| | Trimethylolpropane triacrylate (MW 289) | | 30 | 10 | | 30 | | | 30 | 40 | | 30 | |
| | Trimethylolpropane trimethacrylate (MW 290) | | | | | | | | | | | | |
| | Pentaerythritol tetracrylate (MW 352) | | | 30 | 50 | | | 10 | | | 30 | | |
| Composition for primer forming material | Lauryl acrylate | | | | | | | | | | | | |
| | Benzoinisobutyl ether | 2 | 2 | 2 | 2 | 2 | 2 | 2 | | | 2 | | |
| | Diethoxyacetophenone | | | | | | | | | | | | |
| | Toluene | 100 | 100 | 100 | 100 | 100 | 100 | 100 | 100 | 100 | 100 | 100 | |
| Properties of metallized plastic moldings | Plastic molding substrate | ABS | ABS | ABS | ABS | Acrylic Resin | ABS | Vinyl-chloride resin | Ethylene-propylene copolymer | ABS | ABS | Ethylene-propylene copolymer | ABS |
| | Thickness of primer layer (μ) | 10 | 10 | 10 | 10 | 10 | 10 | 10 | 10 | 10 | 10 | 10 | 10 |
| | *Gel percentage of primer layer(%) | 92 | 98 | 98 | 99 | 91 | 93 | 95 | 96 | 96 | 85 | 77 | 84 |
| | *Swelling degree of primer layer (%) | 11 | 3 | 2 | 1 | 4 | 10 | 5 | 4 | 5 | 25 | 28 | 25 |
| | Dry type metallic film forming method | Vacuum evaporation | Vacuum evaporation | Sputtering | Sputtering | Vacuum evaporation | Vacuum evaporation | Vacuum evaporation | Sputtering | Sputtering | Vacuum Evaporation | Vacuum evaporation | Vacuum evaporation |
| | Kind of metal | Stainless steel | Chromium | Stainless steel | Chromium | Stainless steel | Antimony | Stainless steel | Stainless steel | Stainless steel | Stainless steel | Stainless steel | Stainless Steel |
| | Thickness of metallic film layer (μ) | 0.2 | 0.1 | 0.05 | 0.05 | 0.2 | 0.2 | 0.2 | 0.05 | 0.05 | 0.2 | 0.2 | 0.2 |
| | Adhesiveness | good | good | good | good | good | good | good | good | good | Poor Cracks | Poor Haze | Poor Cracks |
| | Appearance of metallic film | " | " | " | " | " | " | " | " | " | Poor | Poor | Poor |
| | Heat resistance (at 80° C for 24 hours) | " | " | " | " | " | " | " | " | " | " | " | Poor |
| | Water resistance (at 40° C for 240 hours) | " | " | " | " | " | " | " | " | " | " | " | Poor |
| | Moisture resistance (at 50° C, 100% RH for 96 hours) | " | " | " | " | " | " | " | " | " | " | " | Poor |

*The method of measurement of the gel percentage: A sample of dimensions 20 mm × 20 mm × 50 μm was weighed. The sample was dipped in toluene and refluxed for 24 hours at refluxing temperature. Then, the sample was removed and toluene was wiped off by a piece of filter paper. The reduced pressure at 60° C for 24 hours. Thereafter, the sample was weighed. The gel percentage was obtained from the following formula.

$$\frac{\text{Weight of the sample after drying}}{\text{Weight of the initial sample}} \times 100$$

*²The method of measurement of the swelling degree: A sample of dimension 20 mm × 20 mm × 50 μm was dipped in toluene and left therein at 25° C for 24 hours. Then, the sample was dipped in toluene and left therein at 25° C for 24 hours. Then, the sample was dried under reduced pressure until the weight became constant at 60° C and the weight (Y) of the sample was measured. The swelling degree was obtained by the following formula.

$$\frac{(X) - (Y)}{(Y)} \times 100$$

EXAMPLE 10

100 parts of the same primer forming material of experiment No. 1 in Example 1 was blended with 0.5 part of polyoxyethylene-fluorocarbon amide, 0.5 part of $C_5F_7H_4COOC_4H_9$, one part of the quaternary ammonium salt of an alkylamine having a fluorocarbonsulfonamide bond, one part of 1, 1, 1, 3, 3, 3-hexafluoropropylmethacrylate, one part of 1, 1-dihydroperfluoropropylmethacrylate, 2 parts of an allyl siloxane and alkyl siloxane copolymer and one part of sorbitan ester surfactant, respectively, as indicated by experiments No. 13–21. Each of the thus obtained primer forming materials was coated to a thickness of 10 μm on the surface of the ABS resin molding. The layer was irradiated with ultraviolet radiation in air by placing the coated substrate at a distance of 20 cm from a high pressure mercury arc lamp having an intensity of 80 W/cm to form a primer layer. The gel percentage and swelling degree of the resultant primer layers were as shown in Table 2. Stainless steel was vapor deposited to a thickness of 0.2 μm on the primer layers by a vacuum evaporation method whereby metallized plastic moldings were obtained. The properties of the moldings were good as shown in Table 2.

EXAMPLE 12

Using the same primer forming material of experiment No. 3 in Example 3, a primer layer was formed in the same manner as described in Example 11 and then a stainless steel layer 0.05 μm in thickness was formed in the same manner as described in Example 11 by using a sputtering method whereby a metallized plastic molding having a beautiful luster was obtained. The primer layer of the molding had a markedly high pencil hardness of 5H, a gel percentage of 99% and a swelling degree of 1%. This molding was evaluated for the same properties described in Table 1 and it was found that all properties were good.

EXAMPLE 13

Using the same primer forming material as used in experiment No. 14 in Example 10, a metallized plastic molding having a beautiful luster was formed in the same manner described in Example 11. The primer layer had a very high pencil strength of 4H, a gel percentage of 97% and a swelling degree of 3%. This molding was evaluated for the same properties described in table 1 and it was found that all properties were good.

TABLE 2

| Kind of Surfactants added | | Experiment No. | | | | | | | | |
|---|---|---|---|---|---|---|---|---|---|---|
| | | 13 | 14 | 15 | 16 | 17 | 18 | 19 | 20 | 21 |
| Polyoxyethylene fluorocarbonamide | | 0.5 part | | | | | | | | |
| $C_5F_7H_4COOC_4H_9$ | | | 0.5 part | | | | | | | |
| $HC_6F_{12}CH_2OCH_3$ | | | | 0.5 part | | | | | | |
| Quaternary ammonium salt of alkylamine having a flurorocarbon sulfononamide bond | | | | | 1 part | | | | | |
| 1, 1, 1, 3, 3, 3-hexafluoropropyl methacrylate | | | | | | 1 part | | | | |
| 1, 1-dihydroperfluoropropyl methacrylate | | | | | | | 1 part | | | |
| Copolymer of allylsiloxane and alkylsiloxane | | | | | | | | 2 part | | |
| Sorbitan ester surfactant | | | | | | | | | 1 part | 0.05 part |
| Characteristics of primer layer | Gel percentage (%) | 93 | 92 | 92 | 93 | 93 | 92 | 91 | 91 | 95 |
| | Swelling degree (%) | 6 | 5 | 5 | 5 | 7 | 7 | 6 | 8 | 5 |
| Characteristics of metallic film | Presence of strain | No | No | No | No | No | No | No | No | No |
| | Adhesiveness | Good | Good | Good | Good | Good | Good | Good | Good | Good |
| | Metallic luster | " | " | " | " | " | " | " | " | Good |

EXAMPLE 11

The same primer forming material of experiment No. 1 in Example 1 was coated to a thickness of 10 μm on the surface of an ABS resin molding and was irradiated with ultraviolet radiation for 5 seconds in air by placing the coated substrate at a distance of 20 cm from a high pressure mercury lamp of 80 W/cm intensity whereby a plastic molding having a cured primer layer was obtained. Then, the molding was provided with an aqueous layer to a depth of 1 cm and the molding was irradiated with the same ultraviolet radiation as mentioned above for 5 seconds. The primer layer of the thus obtained plastic molding had a high pencil hardness of 3H and had a gel percentage of 96% and a swelling degree of 4%. Stainless steel was vapor deposited to a thickness of 0.2 μm on the ABS resin molding having the primer layer by a vacuum evaporation method whereby a metallized plastic molding having a beautiful luster was obtained. This molding was evaluated for the same properties as mentioned in Table 1 and it was found that all of the properties were good.

Having now fully described this invention, it will be apparent to one of ordinary skill in the art that many changes and modifications can be made thereto without departing from the spirit or scope of the invention set forth herein.

What is claimed as new and intended to be covered by Letters Patent is:

1. A metallized plastic molding, which comprises: (a) a plastic substrate, (b) a primer layer having a gel percentage of at least 80% and a swelling degree of not more than 20%, which is formed by curing a deposited primer forming material which comprises a mixture of a compound (A) having a molecular weight of at least 150 and less than 450 and containing at least two polymerizable unsaturated groups in one molecule and a compound (B) having a molecular weight of 450–2000 and containing at least two polymerizable unsaturated groups in one molecule in a weight ratio (A)/(B) of 1/9-9/1, on a surface of said substrate and (C) a metallic film on said primer layer.

2. The metallized plastic molding of claim 1, wherein said compound (A) is the condensation product of a compound having at least two hydroxyl groups in one molecule and a polymerizable monomer having a carboxyl group.

3. The metallized plastic molding of claim 1, wherein said compound (B) is the addition product of a compound having at least two epoxy groups in one molecule and a polymerizable monomer having carboxyl groups prepared by a ring-opening esterification reaction.

4. The metallized plastic molding of claim 1, wherein the primer layer is formed by curing a primer forming material comprising a mixture of at least one compound having a molecular weight of 150–2000 and containing at least two polymerizable unsaturated groups in one molecule and a leveling agent which is a surfactant in an amount of 0.01–10% by weight of the total amount of said primer forming material.

5. The metallized plastic molding of claim 1, wherein the primer layer is formed by curing a primer forming material comprising a mixture of at least one compound having a molecular weight of 150–2000 and containing at least two polymerizable unsaturated groups in one molecule and a leveling agent selected from the group consisting of fluorine containing monomers and silicone compounds in an amount of 0.01–10% by weight of the total amount of said primer forming material.

* * * * *